United States Patent [19]
Todd et al.

[11] Patent Number: 5,655,291
[45] Date of Patent: Aug. 12, 1997

[54] FORMING RIGID CIRCUIT BOARD

[75] Inventors: Michael George Todd, South Lyon; Robert Edward Belke, Jr., West Bloomfield; Robert Joseph Gordon, Livonia, all of Mich.

[73] Assignee: Ford Motor Company, Dearborn, Mich.

[21] Appl. No.: 494,747

[22] Filed: Jun. 26, 1995

[51] Int. Cl.⁶ .................................................... H05K 3/36
[52] U.S. Cl. ............................................ 29/830; 156/322
[58] Field of Search ........................ 29/830, 846; 156/322

[56] References Cited

U.S. PATENT DOCUMENTS

| | | |
|---|---|---|
| 3,255,299 | 6/1966 | Hartsock . |
| 3,810,816 | 5/1974 | Zachariades . |
| 3,971,127 | 7/1976 | Giguere et al. . |
| 4,460,427 | 7/1984 | Haney et al. .................. 156/322 X |
| 4,659,425 | 4/1987 | Eggers et al. .................. 156/322 X |
| 4,662,973 | 5/1987 | Gotou et al. . |
| 4,670,080 | 6/1987 | Schwarz et al. .................. 156/322 X |
| 4,742,183 | 5/1988 | Soloway et al. . |
| 4,851,613 | 7/1989 | Jacques . |
| 5,144,534 | 9/1992 | Kober . |
| 5,170,326 | 12/1992 | Meny et al. . |
| 5,288,950 | 2/1994 | Ushio et al. . |

*Primary Examiner*—Carl J. Arbes
*Attorney, Agent, or Firm*—Joseph W. Malleck

[57] ABSTRACT

A method and apparatus for forming a rigid circuit board uses a circuit board with a reduced thickness in a bend region. The bend region may have several layers of laminate and conductive material. The circuit board is heated to the glass transition temperature which allows the circuit board to become flexible. The apparatus has two rollers used to form the bend region to a predetermined shape. When the circuit is cooled, the circuit board again becomes rigid in its predetermined shape.

7 Claims, 2 Drawing Sheets

FORMING RIGID CIRCUIT BOARD

BACKGROUND OF THE INVENTION

The present invention relates generally to the manufacture of printed circuit boards and, more specifically, to a method for forming a folded rigid circuit board.

Space constraints are a significant burden in the designing of electronic modules. Electronic circuit designers have a continual need to provide an increasing amount of circuitry in a smaller amount of space.

One way to reduce the package size of a module is to mount portions of the circuit opposite each other within the module. Mounting a circuit board in this manner may be accomplished in several ways.

One way to construct such a module is to manufacture the circuit traces on a flexible film such as a polyimide film or polyester substrate film. The film is bent to fit within the module. Such films, however, have a relatively high cost and are not well suited for high temperature processing techniques desirable for high volume production. Another drawback is that circuit traces are limited to a single thickness making the routing of such traces difficult in intricate circuit designs. Another technique is to manufacture two separate rigid circuit boards and interconnect them with a flexible film portion. One drawback to this configuration is that connectors must be provided at the rigid/flexible circuit board interface. Another drawback is that circuit traces in the flexible portion are limited to a single thickness. Yet another drawback to such a system is that the circuit boards typically are manufactured in one location and populated in another location. The circuit boards are populated in separate locations and must then both be relocated to a further location to be interconnected in the module, thereby adding to the complexity of the manufacturing process.

Another packaging technique is to bend a circuit board as described in U.S. Pat. No. 3,255,299. In this patent, a circuit board having one conductive layer is cut thinly in one region and bent only ninety degrees. The circuit board is cut so thin that the board becomes flexible. Such a circuit board is not adapted to unbending or rebending. These would result in separating the conductor from the substrate. Unbending is a desirable feature since circuit boards are commonly reworked to repair defects. The design shown in this patent is also limited to one layer of conductive material in the thinly cut area.

It would therefore be desirable to have a circuit board with multilayers of traces capable of flexing in a region capable of repeated bending.

SUMMARY OF THE INVENTION

One advantage of the present invention is that the rigid circuit board can be populated and bent as integral steps in a continuous manufacturing line.

Another advantage of the present invention is that the circuit board can be reworked without reducing the reliability of the circuit board.

Yet another advantage is the ability to have multiple conductor layers in the flex region.

In the present invention a circuit board is heated to the glass transition temperature of the circuit board. The circuit board is bent at a predetermined area to a predetermined shape. The circuit board is then cooled so that said circuit board retains the predetermined shape.

DETAILED DESCRIPTION OF THE PREFERRED EMBODIMENT

Figure 1:
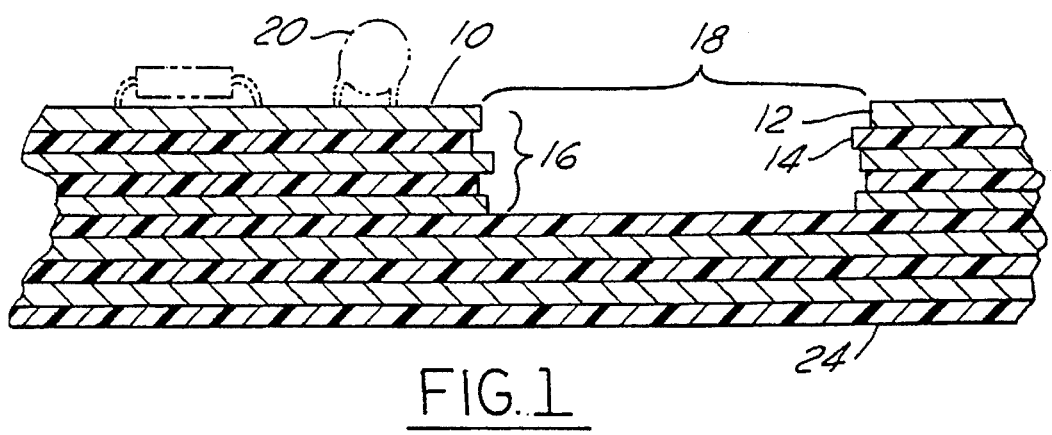
FIG. 1 is a cross section of a multilayer circuit board having an area of reduced cross section.

Referring to FIG. 1, a circuit board 10 has several alternating layers of conductive traces 12 and laminate 14. Conductive traces 12 are made from an electrically conductive material such as copper. Laminate 14 is an electrically insulative circuit board material such as FR4 which is a flame retardant epoxy-glass fabric composite. Laminate 14 becomes flexible upon the application of relatively high temperatures i.e., thermoplastic or thermoset materials are used and the glass transition ($t_g$) is exceeded, resulting in elastomeric mechanical behavior.

A groove 16 is cut into circuit board 10 to form a bend region 18. Groove 16 is preferably machined conventionally by using a carbide end-mill, fly cutter, or similar tool. Machining preferably is performed before circuit board 10 is populated with electrical components 20. Machining can also take place after component population. When circuit board 10 undergoes bending as described below the top surface, as illustrated, is a compression side 22, whereas the bottom surface is a tension side 24. Machining is preferably performed on compression side 22. Conductive traces 12 are located within circuit board 10 in a manner so that they are undisturbed during the machining process. A common circuit routing program may be used to route conductive traces 12 preferentially toward tension side 24, for example.

Groove 16 is cut deep enough to allow bending under elevated temperatures as further described below while keeping circuit board 10 rigid at ambient temperatures during population with electrical components, testing and shipment. The thickness in bend region 18 after cutting of groove 16 is typically below 25 mils. The width of bend region 18 will vary depending on the thickness of the remaining material in bend region, the number of layers of conductive traces 12, and the amount circuit board 10 will be bent. For example, if a circuit board having 0.062 in. thickness is cut to a depth of 0.040 in. a bend region of at least 0.5 in. provides sufficient width.

Figure 2A:
FIGS. 2a and 2b are alternative groove patterns from that shown in FIG. 1.
Figure 2B:
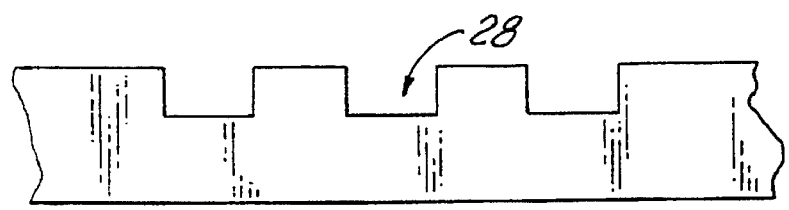

Referring now to FIG. 2, the shape of groove 16 is not limited to being rectangular as shown in FIG. 1. Groove 16 may also be comprised as a series of V-grooves 26 as shown in FIG. 2a. Groove 16 may also be formed of a series of rectangular-shaped grooves 28 as shown in FIG. 2b. These grooved features offer the advantage of increased torsional stiffness as well as the possibility of adhesive bonding of the final bent configuration. The grooves also control the radii of curvature of circuit board 10.

Figure 3:
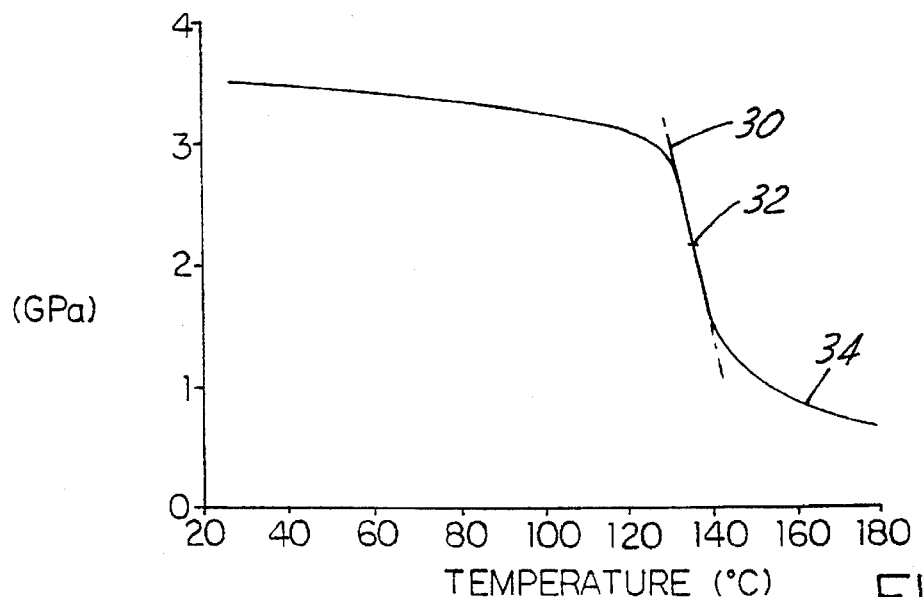
FIG. 3 is a plot of modulus versus temperature of FR4 circuit board material.

Referring now to FIG. 3, a plot of the shear storage modulus (in gigapascals) as a function of temperature (centigrade)for laminate material FR4 is shown. Bending of circuit board 10 is performed when bend region 18 is heated above the glass transition temperature of laminate 14. Several close temperature points on the plot may be identified as the glass transition temperature points. Point 30 is called the onset glass transition temperature which is where laminate starts to become flexible. Point 32 is called the inflection glass transition temperature. Point 34 is a temperature when the laminate acts as an elastomer. While bending can occur at either the onset or inflection temperature, it is preferred that bending occur when the circuit board is the most flexible i.e., when the board acts as an elastomer. Laminate acts as an elastomer at temperatures above those at point 34 which is about 160° C.

Figures 4, 5:
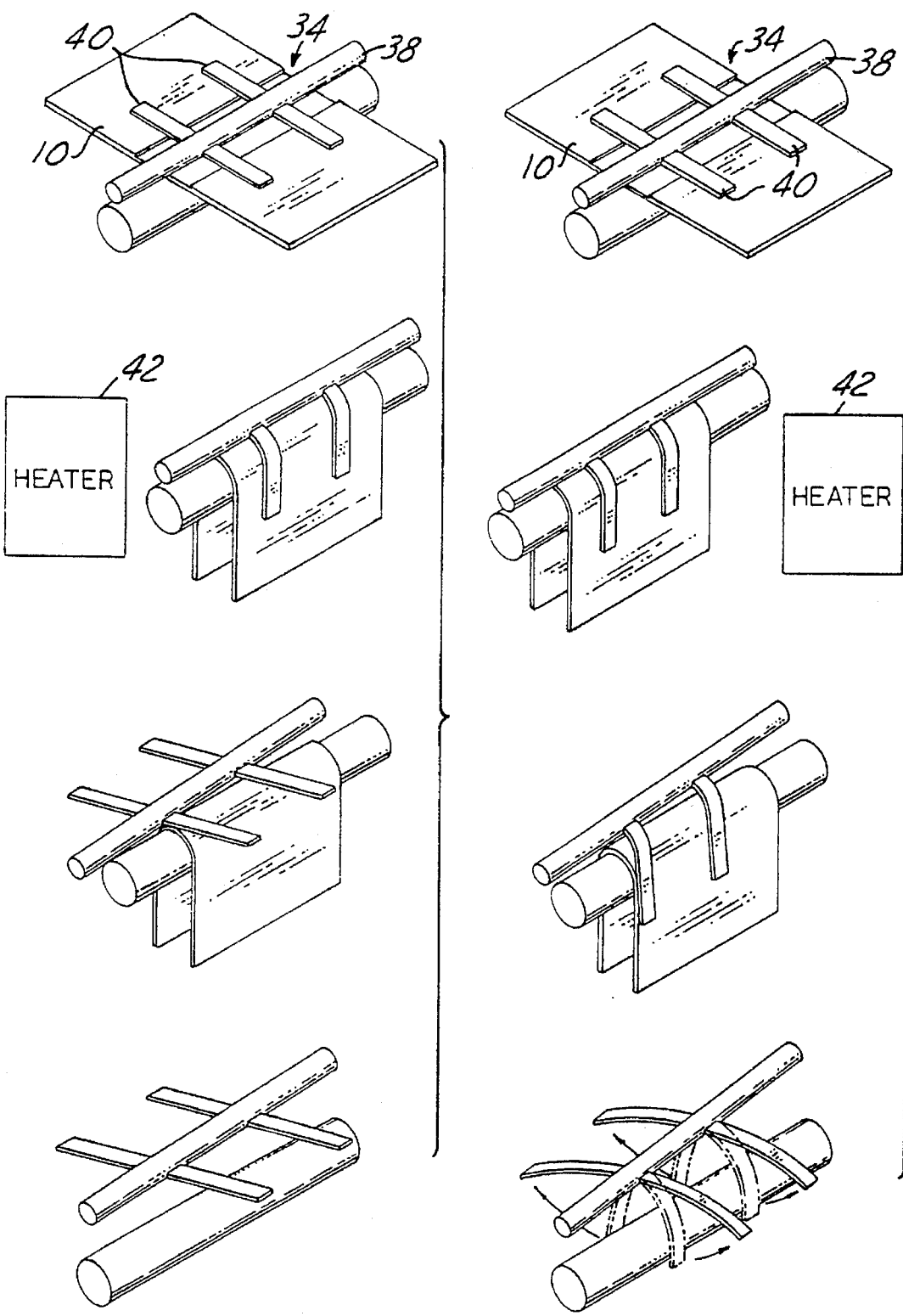
FIG. 4 is an apparatus for bending a circuit board according to the present invention.
FIG. 5 is a circuit board bent according the present invention.

Referring now to FIG. 4, the bending of circuit board 10 is preferably performed as an integral step in a continuous assembly process. Circuit board 10 is machined in the bend region 18 to a thickness to allow bending when heated but otherwise thick enough to remain rigid at ambient temperatures. After circuit board 10 is populated and soldered in a sequential assembly process, circuit board 10 is processed through a bending apparatus 34. Bending apparatus 34 has a compliant clamp 36, a stationary roller 38 and a moving roller 40.

Compliant clamp 36 secures one end of circuit board 10 in place during heated bending. Compliant clamp 36 is compliantly secures circuit board 10 in place without damaging electrical components mounted to board 10. Compliant clamp 36 is preferably made of silicone rubber or silicone rubber foam of appropriate durometer.

Stationary roller 38 is sized so that bend region of circuit board 10 is formed around its outer arc. Moving roller 40 forms bend region around stationary roller 38.

Heating circuit board 10 beyond its glass transition temperature is preferably accomplished locally by heat generated by both stationary roller 38 and moving roller 40. Heating of circuit board 10 may also occur by passing circuit board 10 through an oven or other heating unit. Other heat intensive circuit processes such as reflow or wave soldering may also be used to contribute heat to the process.

Referring now to FIG. 5, after circuit board 10 is bent by relative motion of rollers 38 and 40, heat is removed from circuit board 10. When circuit board 10 is cooled, it again becomes rigid retaining its desired shape. If rework is desired, circuit board 10 may be easily reheated in bend region 18 and unbent for access to components 20.

The present invention is intended to include modifications which would be apparent to those skilled in the art. For example, different laminate materials, different methods of bending, and different number of layers of conductor and laminate may also be used.

What is claimed is:

1. A method of forming a rigid multilayer circuit board having a first thickness and made of a plastic material comprising the steps of:

heating said circuit board to a glass transition temperature of said circuit board;

bending said circuit board at a predetermined area to a predetermined shape;

cooling said circuit board so that said circuit board retains said predetermined shape; and reducing said thickness of a circuit board in said predetermined area so that said circuit board remains rigid.

2. A method of forming a rigid circuit board as recited in claim 1 wherein said circuit board has a tension side and a compression side;

wherein said step of reducing said thickness comprises removing material on said compression side of said circuit board.

3. A method of forming a rigid circuit board as recited in claim 1 whereby the step of forming comprises the steps of:

clamping said circuit board;

providing a moving roller and a stationary roller on opposite sides of said circuit board;

moving said moving roller so that said circuit board bends around said stationary roller.

4. A method of forming a rigid multilayer circuit board having a first thickness, a plurality of laminate layers having a glass transition temperature and a plurality of conductive layers comprising the steps of:

forming a bend region in said circuit board by reducing said thickness of a circuit board in a predetermined area so that said predetermined area remains rigid;

heating said bend region to said glass transition temperature of said laminate layers;

bending said circuit board at said bend region to a predetermined shape;

cooling said bend region to below said glass transition temperature of said laminate layers thereby retaining said predetermined shape.

5. A method of forming a rigid circuit board as recited in claim 4 wherein said predetermined area contains at least two layers of conductive material.

6. A method of forming a rigid circuit board having a first thickness, a plurality of laminate layers having a glass transition temperature and a plurality of conductive layers comprising the steps of:

forming a bend region in said circuit board by reducing said thickness of a circuit board in a predetermined area so that said predetermined area remains rigid;

clamping a first portion of said circuit board in a fixed position while allowing a second portion of said circuit board to move;

heating said bend region to said glass transition temperature of said laminate layers;

forming said bend region around a stationary roller into a predetermined shape;

cooling said bend region to below said glass transition temperature of said laminate layers so that said bend region becomes rigid and retains said predetermined shape.

7. A method of forming a rigid circuit board as recited in claim 6 wherein said predetermined area contains at least two layers of conductive material.

* * * * *